United States Patent
Akiyama

(10) Patent No.: US 6,285,970 B1
(45) Date of Patent: *Sep. 4, 2001

(54) COMPUTER SIMULATION METHOD OF SILICON OXIDATION

(75) Inventor: Yutaka Akiyama, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/200,749

(22) Filed: Nov. 30, 1998

(30) Foreign Application Priority Data

Nov. 28, 1997 (JP) .................................... 9-327616

(51) Int. Cl.$^7$ ................. G06F 7/60; G06F 17/10
(52) U.S. Cl. ............................................. 703/2
(58) Field of Search .................................... 703/2

(56) References Cited

U.S. PATENT DOCUMENTS

| | | | |
|---|---|---|---|
| 5,819,073 | * 10/1998 | Nakamura | 395/500.21 |
| 5,930,494 | * 7/1999 | Akiyama | 395/500.28 |
| 6,011,914 | * 10/1998 | Akiyama | 703/143 |

OTHER PUBLICATIONS

"Simulation for design and fabrication of VLSIs", pp. 51–63 edited by M. Morisue and published by CMC Corporation in 1987, No Translation.

"Simulation Techniques of semiconductor devices and processes", pp. 79–89, edited by K. Taniguchi and published by the Realize Incorporated in 1990, No Translation.

European Search Report dated Jan. 14, 2000.

"Two–Dimensional Simulation of Local Oxidation of Silicon: Calibrated Viscoelastic Flow Analysis", pp. 720–731, Senez et al. IEEE Transactions on Electron Devices, No. 5, May 1996.

"Numerical Techniques on Enhancing Robustness for Stress–Dependent Oxidation Simulation Using Finite Element Method in SUPREM–IV", pp. 150–155, Oda et al.

"A Simulation System for Diffusive Oxidation of Silicon: A Two–Dimensional Finite Element Approach", pp. 543–550, Rank et al., IEEE Transactions or Computer–Aided Design of Integrated and Systems (1990) May, No.5, New York, US.

"Novel: A Nonlinear Viscoelastic Model for Thermal Oxidation of Silicon", pp.341–353,Chidambarrao et al., The International Journal for Computation and Mathematics in Electrical and Electronic Engineering vol. 10, No. 4, (c) James & James Science Publishers Ltd.

* cited by examiner

Primary Examiner—Kevin J. Teska
Assistant Examiner—Hugh Jones
(74) Attorney, Agent, or Firm—McGinn & Gibb, PLLC

(57) ABSTRACT

A simulation method of Si oxidation is provided, which decreases the simulation time. A diffusion equation of oxidant is solved at individual nodes in a $SiO_2$ region to calculate the surface concentration of the oxidant at the $Si/SiO_2$ interface, resulting in the first value of the surface concentration of the oxidant at each of the nodes in the present time step. Then, the first value of the surface concentration of the oxidant at each of the nodes in the $SiO_2$ region is adjusted to generate the second value of the surface concentration of the oxidant at each of the nodes in the $SiO_2$ region in the present time step. Also, the second value of the surface concentration of the oxidant in the present time step is set as zero with respect to one of the nodes where the thickness increase of the $SiO_2$ region has a value equal to or less than the specific small value. Simultaneously with this, the first value of the surface concentration of the oxidant is stored for a next time step. The stored first value of the surface concentration of the oxidant is added to a first value of the surface concentration of the oxidant obtained in the next time step, thereby producing a second value of the surface concentration of the oxidant in the next time step. The second value of the surface concentration of the oxidant is used in calculation of the thickness increase of the $SiO_2$ region.

16 Claims, 8 Drawing Sheets

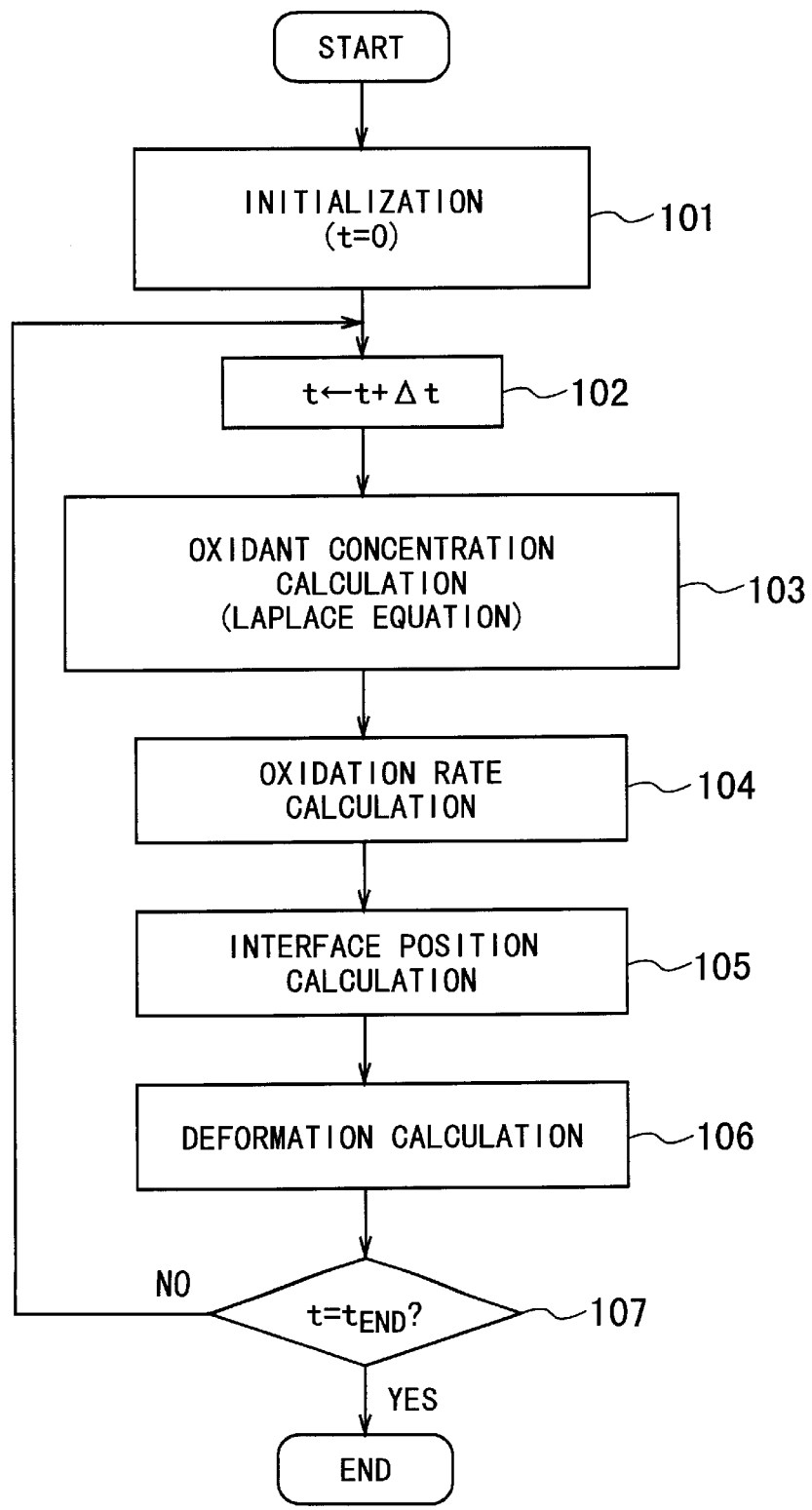

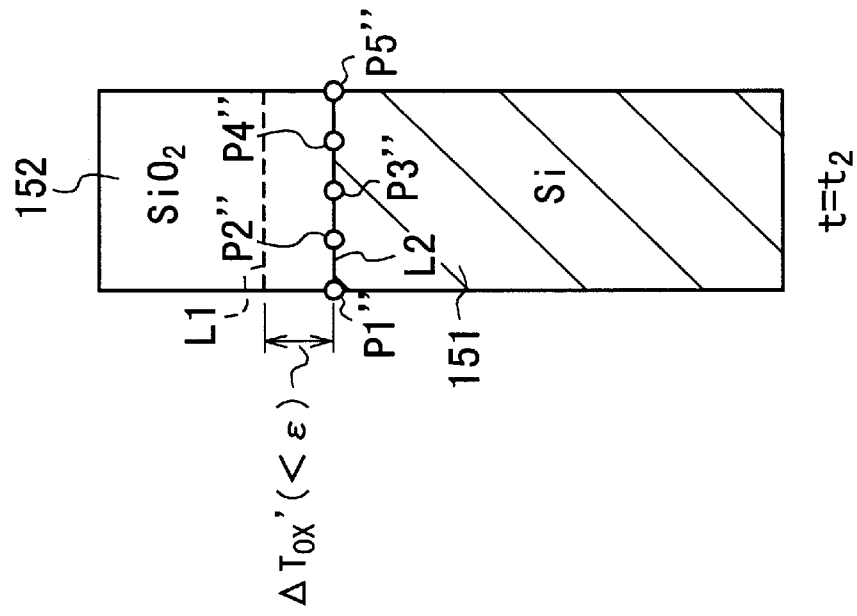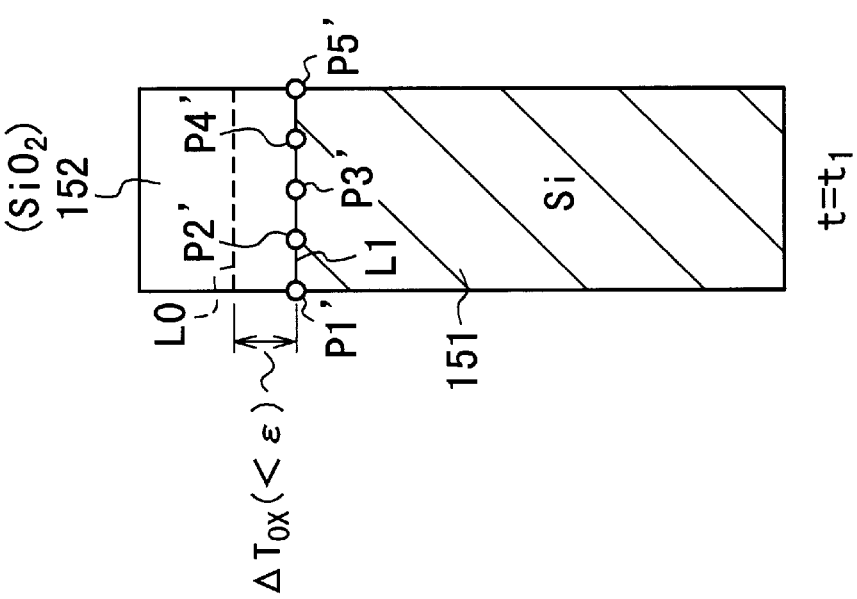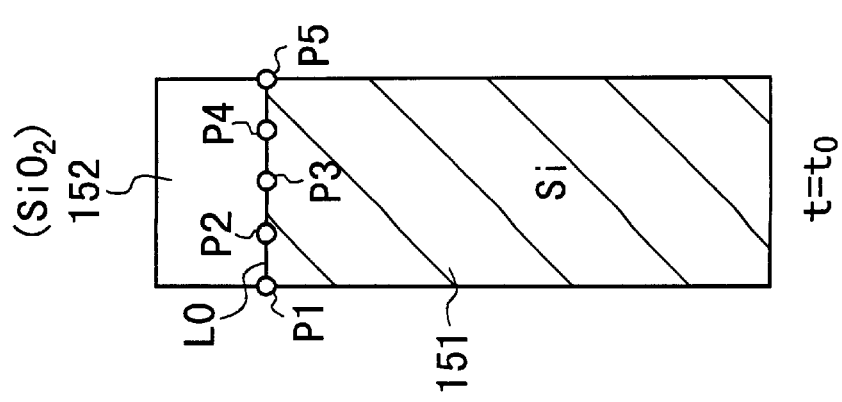

COMPUTER SIMULATION METHOD OF SILICON OXIDATION

BACKGROUND OF THE INVENTION

1. Field of the Invention

The present invention relates to a process simulation method using a computer system applicable to semiconductor device fabrication and more particularly, to a computer simulation method of oxidation of silicon (Si), in which the diffusion equation of oxidant is solved to find the surface concentration of the oxidant at the interface between a Si region and a silicon dioxide ($SiO_2$) region.

2. Description of the Prior Art

A process simulator is a computer system to simulate various processes in the semiconductor device fabrication, such as oxidation, diffusion, etching, and ion-implantation, thereby predicting the details of the resulting device structure, such as profiles of doped impurities and topography of conductive or dielectric materials. If the device structure of a Large-Scale Integrated circuit (LSI) is optimized by the use of the process simulator in such a way that the LSI exhibits the desired electrical characteristics, the developmental cost and period for the LSI can be drastically reduced compared with the case where the LSI is actually fabricated for the purpose of experiments.

Conventionally, the process simulator designed for semiconductor device fabrication is equipped with built-in simulation models applicable to the individual fabrication processes. For example, a simulation model of the time-dependent thickness of an oxide region is disclosed in a book entitled "Simulation for design and fabrication of VLSIs", on pp. 51–63, edited by M. Morisue and published by the CMC corporation in 1987. In this model, the following Deal-Grove equation is used.

$$\frac{dT_{ox}}{dt} = \frac{B}{2T_{ox}^{old} + A} \quad (1)$$

In the equation (1), t is the time, $T_{ox}$ is the thickness of the oxide region at the present time, $T_{ox}^{old}$ is the thickness of the oxide region at the prior time, and A and B are parameters relating to the oxidation rate of a region to be oxidized.

On the other hand, individual electronic elements and/or components need to be electrically isolated in the LSI. This electrical isolation is usually realized by the selective oxidation method termed the "LOCal Oxidation of Silicon (LOCOS)" using a silicon nitride film formed on the surface of a semiconductor substrate as an oxidation mask, or the trench isolation method using trenches formed at the surface of a semiconductor substrate and filled with a dielectric.

In recent years, as the integration level of the electronic elements and components in the LSI has increased, the electronic elements and components have been miniaturized more and more. Under such the circumstances, there has been the need to simulate the isolation process for realizing the electrical isolation using the selective oxidation or trench isolation method. Also, several two-dimensional simulation methods of the isolation process have been developed.

An example of the conventional simulation methods of the isolation process using the LOCOS method is disclosed in a book entitled "Simulation Techniques of semiconductor devices and processes", on pp. 79–89, edited by K. Taniguchi and published by the Realize Incorporated in 1990. This method is explained below with reference to FIG. 1.

FIG. 1 shows the flowchart of the conventional simulation method for the LOCOS method disclosed in the Taniguchi's book.

In the step 101, desired nodes are configured onto a whole simulation zone where a $SiO_2$ region is formed in contact with a Si region, and at the same time, the predetermined initial condition are applied to the individual nodes for setting the initial data. Also, the value of the time t is set as zero, i.e., t=0.

As seen from this description, it is assumed that the $SiO_2$ region initially exists in contact with the Si region prior to the start of the oxidation process. In an actual oxidation process of Si, the surface of a single-crystal Si substrate is usually covered with a native $SiO_2$ film prior to the oxidation process. Therefore, the $SiO_2$ region is assumed to be contacted with the Si region at the start of oxidation.

In the step 102, the value of a preset time increment $\Delta t$ is added to the present value (i.e., 0) of the time t. Thus, a first one of the time steps is started.

In the step 103, the following diffusion equation (2) (i.e., the Laplace's equation) of oxidant is constituted in the $SiO_2$ region, where $C_{ox}$ is the concentration of the oxidant and $D_{ox}$ is the diffusion coefficient of the oxidant. This is because the oxidant existing in the oxidizing atmosphere is diffused through the $SiO_2$ region to the opposing surface of the Si region.

$$D_{ox} \cdot \nabla^2 C_{ox} = 0 \quad (2)$$

Then, the diffusion equation (2) is discretely solved at the individual nodes, thereby finding the surface concentration $C_{ox}^{surf}$ of the oxidant at the interface between the Si and $SiO_2$ regions (i.e., the $Si/SiO_2$ interface) in the first time step.

Subsequently, in the step 104, using the surface concentration $C_{ox}^{surf}$ of the oxidant thus found, the oxidation rate ($dT_{ox}/dt$) of the Si region, which is given by the time-dependent thickness $T_{ox}$ of the $SiO_2$ region, in the first time step is calculated at the individual nodes by the use of the following equation (3)

$$\frac{dT_{ox}}{dt} = K \cdot C_{ox}^{surf} \quad (3)$$

where K is a coefficient of the oxidation reaction. The orientation of the oxidation rate ($dT_{ox}/dt$) of the Si region is set in a direction perpendicular to the $Si/SiO_2$ interface.

The equation (3) means that the oxidation rate of the Si region, i.e., the time-dependent thickness ($dT_{ox}/dt$) of the $SiO_2$ region, is proportional to the surface concentration $C_{ox}^{surf}$ of the oxidant at the $Si/SiO_2$ interface is assumed in this conventional simulation method.

In the step 105, a new or post-oxidation position of the $Si/SiO_2$ interface is calculated by multiplying the value of the oxidation rate ($dT_{ox}/dt$) at the $Si/SiO_2$ interface thus found in the step 104 by the value of the time increment $\Delta t$ at the individual nodes.

In the step 106, using the new or post-oxidation position of the $Si/SiO_2$ interface thus found in the step 105, the shape or geometric deformation of the Si and $SiO_2$ regions due to oxidation in the first time step is calculated.

In the step 107, it is judged whether the present value of the time t in the fist time step is equal to the value of the end time $t_{END}$ or not. If the answer is "NO", the second time step is started and the steps 102 to 106 are performed again. Further, in the same way as above, the steps 102 to 106 are repeated in the third time step and later time steps until the answer of "YES" is given. If the answer is "YES", the flow of the steps 102 to 106 is stopped.

FIGS. 2A to 2C schematically show the one-dimensional, time-dependent shape change of Si and $SiO_2$ regions in an oxidation process, to which the above-described conventional simulation method shown in FIG. 1 is applied.

At the time $t_0$, as shown in FIG. 2A, nodes P1, P2, P3, P4, and P5 are configured one-dimensionally along an interface L0 between Si and $SiO_2$ regions 151 and 152. The nodes P1, P2, P3, P4, and P5 are equally spaced along the $Si/SiO_2$ interface L0. This is performed in the step 101 in FIG. 1.

Although not shown in FIGS. 2A to 2C, it is needless to say that other nodes are configured two-dimensionally on the whole Si and $SiO_2$ regions 151 and 152.

At the time $t_1$ after the specific time increment $\Delta t$ from the time $t_0$ (or, in the first time step), as shown in FIG. 2B, the nodes P1, P2, P3, P4, and P5 are shifted perpendicular to the $Si/SiO_2$ interface L0 toward the Si region 151. Thus, the nodes P1, P2, P3, P4, and P5 and the $Si/SiO_2$ interface L0 are moved to their new positions, resulting in new nodes P1', P2', P3', P4', and P5' and a new $Si/SiO_2$ interface L1. This movement is carried out by the use of the new or post-oxidation position of the $Si/SiO_2$ interface L0 obtained through the steps 102 to 105 in FIG. 1.

Thus, using the result of the calculation about the oxidation rate ($dT_{ox}/dt$) of the $SiO_2$ region 152 in the step 104 and the result of calculation about the shape deformation of the Si and $SiO_2$ regions 151 and 152 in the step 106, the thickness of the $SiO_2$ region 152 is increased by a thickness increment $\Delta T_{ox}$ occurring in this first step.

Accordingly, the Si and $SiO_2$ regions 151 and 152 have the shapes as shown in FIG. 2B, in which the thickness of the $SiO_2$ region 152 is increased while the thickness of the Si region 151 is decreased due to oxidation.

At this stage, the new nodes P1', P2', P3', P4', and P5' are located on the new $Si/SiO_2$ interface L1. The new $Si/SiO_2$ interface L1 is apart from the old $Si/SiO_2$ interface L0 by the thickness increment $\Delta T_{ox}$ toward the Si region 151.

This shift of the $Si/SiO_2$ interface L0 is carried out not only when the thickness increment $\Delta T_{ox}$ is equal to or greater than a specific small value $\epsilon$ (i.e., $\Delta T_{ox} \geq \epsilon$) but also when the thickness increment $\Delta T_{ox}$ is less than the specific small value $\epsilon$ (i.e., $\Delta T_{ox} < \epsilon$).

Similarly, at the time $t_2$ after the same specific time increment $\Delta t$ from the time $t_1$ (or, in the second time step), as shown in FIG. 2C, the nodes P1', P2', P3', P4', and P5' are shifted again perpendicular to the $Si/SiO_2$ interface L1 toward the Si region 151. Thus, the nodes P1', P2', P3', P4', and P5' and the $Si/SiO_2$ interface L1 are moved to their new positions, resulting in new nodes P1'', P2'', P3'', P4'', and P5'' and a new $Si/SiO_2$ interface L2. This movement is carried out by the use of the new or post-oxidation position of the $Si/SiO_2$ interface L1 obtained in the steps 102 to 105.

Thus, in the same way as explained for the nodes P1, P2, P3, P4, and P5, the thickness of the $SiO_2$ region 152 is increased by a thickness increment $\Delta T_{ox}'$ occurring in this second time step.

Accordingly, the Si and $SiO_2$ regions 151 and 152 have the shapes as shown in FIG. 2C, in which the thickness of the $SiO_2$ region 152 is further increased while the thickness of the Si region 151 is further decreased due to oxidation.

At this stage, the new nodes P1'', P2'', P3'', P4'', and P5'' are located on the new $Si/SiO_2$ interface L2. The new $Si/SiO_2$ interface L2 is apart from the old $Si/SiO_2$ interface L1 by the thickness increment $\Delta T_{ox}'$ toward the Si region 151.

This shift of the $Si/SiO_2$ interface L1 is carried out not only when the thickness increment $\Delta T_{ox}'$ is equal to or greater than the specific small value $\epsilon$ (i.e., $\Delta T_{ox}' \geq \epsilon$) but also when the thickness increment $\Delta T_{ox}'$ is less than the specific small value $\epsilon$ (i.e., $\Delta T_{ox}' < \epsilon$).

As explained above, with the above-described conventional simulation method shown in FIG. 1, to find or determine the one-dimensional, time-dependent shape change of the Si and $SiO_2$ regions 151 and 152 shown in FIGS. 2A to 2C in each time step, the calculation steps 103 to 106 are always carried out even if the thickness increments $\Delta T_{ox}$ and $\Delta T_{ox}'$ are less than the specific small value $\epsilon$ (i.e., $\Delta T_{ox} < \epsilon$ and $\Delta T_{ox}' < \epsilon$) due to the slight thickness growth of the $SiO_2$ region 152, as shown in FIGS. 2A to 2C.

FIG. 3 schematically shows the two-dimensional, time-dependent shape change of Si and $SiO_2$ regions in an oxidation process, to which the above-described conventional simulation method shown in FIG. 1 is applied. FIG. 3 shows the state of the Si and $SiO_2$ regions in the neighborhood of the edge of an oxidation mask (not shown) made of $Si_3N_4$.

At the time $t_0$, nodes P(n), P(n+1), P(n+2), P(n+3), and P(n+4) are configured two-dimensionally along an interface L0 between Si and $SiO_2$ regions 141 and 143. The nodes P(n), P(n+1), P(n+2), P(n+3), and P(n+4) are spaced along the $Si/SiO_2$ interface L0. This is performed in the step 101 in FIG. 1.

Although not shown in FIG. 3, it is needless to say that other nodes are configured two-dimensionally on the whole Si and $SiO_2$ regions 141 and 143.

At the time $t_1$ after a specific time increment $\Delta t$ from the time $t_0$ (or, in the first time step), the nodes P(n), P(n+1), P(n+2), P(n+3), and P(n+4) are shifted toward the Si region 141. Thus, the nodes P(n), P(n+1), P(n+2), P(n+3), and P(n+4) and the $Si/SiO_2$ interface L0 are shifted toward the Si region 141. Thus, the nodes P(n), P(n+1), P(n+2), P(n+3), and P(n+4) and the $Si/SiO_2$ interface L0 are moved to their new positions, resulting in new nodes P(n)', P(n+1)', P(n+2)', P(n+3)', and P(n+4)' and a new $Si/SiO_2$ interface L1. This movement is carried out by the use of the new or post-oxidation position of the $Si/SiO_2$ interface L0 obtained through the steps 102 to 105 in FIG. 1.

Thus, using the result of the calculation about the oxidation rate ($dT_{ox}/dt$) of the $SiO_2$ region 141 in the step 104 and the result of calculation about the shape deformation of the Si and $SiO_2$ regions 141 and 143 in the step 106, the thickness of the $SiO_2$ region 143 is increased at the nodes P(n)', P(n+1)', P(n+2)', P(n+3)', and P(n+4)' by corresponding thickness increments $\Delta T_{ox}$ occurring in this first time step.

Accordingly, the Si and $SiO_2$ regions 141 and 143 have the shapes defined by the interface L1, as shown in FIG. 3, in which the thickness of the $SiO_2$ region 143 is increased while the thickness of the Si region 141 is decreased due to oxidation.

At this stage, the new nodes P(n)', P(n+1)', P(n+2)', P(n+3)', and P(n+4)' are located on the new $Si/SiO_2$ interface L1. The new $Si/SiO_2$ interface L1 is apart from the old $Si/SiO_2$ interface L0 by corresponding thickness increments $\Delta T_{ox}$ toward the Si region 141.

This shift of the $Si/SiO_2$ interface L0 is carried out not only when the thickness increment $\Delta T_{ox}$ is equal to or greater than a specific small value $\epsilon$ (i.e., $\Delta T_{ox} \geq \epsilon$) but also when the thickness increment $\Delta T_{ox}$ is less than the specific small value $\epsilon$ (i.e., $\Delta T_{ox} < \epsilon$).

Similarly, at the time $t_2$ after the same time increment from the time $t_1$ (or, in the second time step), the nodes P(n)', P(n+1)', P(n+2)', P(n+3)', and P(n+4)' are shifted again toward the Si region 141. Thus, the nodes P(n)', P(n+1)', P(n+2)', P(n+3)', and P(n+4)' and the $Si/SiO_2$ interface L1 are moved to their new positions, resulting in new nodes P(n)'', P(n+1)'', P(n+2)'', P(n+3)'', and P(n+4)'' and a new $Si/SiO_2$ interface L2. This movement is carried out by the use of the new or post-oxidation position of the Si/SiO$_2$ interface L1 obtained in the step 105 obtained in the steps 102 to 105.

Thus, in the same way as explained for the nodes P(n)', P(n+1)', P(n+2)', P(n+3)', and P(n+4)', the thickness of the SiO$_2$ region 143 is increased at the individual nodes P(n)", P(n+1)", P(n+2)", P(n+3)", and P(n+4)" by corresponding increments occurring in this second time step.

Accordingly, the Si and SiO$_2$ regions 141 and 143 have the shapes defined by the new interface L2, as shown in FIG. 3, in which the thickness of the SiO$_2$ region 143 is further increased while the thickness of the Si region 141 is further decreased due to oxidation.

At this stage, the new nodes P(n)", P(n+1)", P(n+2)", P(n+3)", and P(n+4)" are located on the new Si/SiO$_2$ interface L2. The new Si/SiO$_2$ interface L2 is apart from the old Si/SiO$_2$ interface L1 by corresponding thickness increments $\Delta T_{ox}$ toward the Si region 141.

This shift of the Si/SiO$_2$ interface L1 is carried out not only when the thickness increment $\Delta T_{ox}$ is equal to or greater than a specific small value $\epsilon$ (i.e., $\Delta T_{ox} \geq \epsilon$) but also when the thickness increment $\Delta T_{ox}$ is less than the specific small value $\epsilon$ (i.e., $\Delta T_{ox} < \epsilon$).

As explained above, with the above-described conventional simulation method shown in FIG. 1, to find or determine the two-dimensional, time-dependent shape change of the Si and SiO$_2$ regions 141 and 143 shown in FIG. 3 in each time step, the calculation steps 103 to 106 are always carried out even if the individual thickness increments $\Delta T_{ox}$ at the nodes are less than the specific small value $\epsilon$ (i.e., $\Delta T_{ox} < \epsilon$ and $\Delta T_{ox}' < \epsilon$) due to the slight thickness growth of the SiO$_2$ region 143.

With the above-described conventional simulation method as shown in FIG. 1, as explained with reference to FIGS. 2A to 2C and FIG. 3, the calculation steps 103 to 106 are always carried out independent of the magnitude of the individual thickness increments $\Delta T_{ox}$ at the individual nodes. Therefore, there is a problem that it takes very long time to simulate an oxidation process of Si.

In the case of the LOCOS method, a silicon nitride (Si$_3$N$_4$) film is typically formed on a surface of a single-crystal Si substrate as an oxidation mask, and then, the Si substrate with the Si$_3$N$_4$ mask is selectively oxidized in an oxidizing atmosphere. During this oxidation process, oxidant existing in the oxidizing atmosphere diffuses through a SiO$_2$ region (i.e., native oxide of Si) existing initially on the uncovered surface of the Si substrate.

However, in the vicinity of the edge of the Si$_3$N$_4$ mask, the concentration of the oxidant is very low due to existence of the Si$_3$N$_4$ mask and as a result, the growth rate of SiO$_2$ is very small.

As a result, considering this fact, it is found that unnecessary calculation is carried out in the above-described conventional simulation method shown in FIG. 1. Since the deformation calculation in the step 106 necessitates a very long time, the calculation time in the step 106 applies a large influence to the necessary simulation time.

To omit the unnecessary calculation, there is a solution that the growth rate of the SiO$_2$ region 152 or 143 is set as zero if the thickness increment of the SiO$_2$ region 152 or 143 is equal to or less than specific value (e.g., 1Å). In this case, however, there arises the following problem.

Specifically, when the oxidation rate of the Si region 151 or 141 is low due to a low oxidizing temperature and simultaneously, the time increment $\Delta t$ is set as short as possible to improve the simulation accuracy, there arises a problem that the thickness growth or increase of the SiO$_2$ region 152 or 143 does not occur even after a long time is passed or a lot of time steps are carried out.

SUMMARY OF THE INVENTION

Accordingly, an object of the present invention is to provide a simulation method of Si oxidation that decreases the time necessary for simulation of Si oxidation.

Another object of the present invention is to provide a simulation method of Si oxidation that makes it possible to omit unnecessary calculation steps relating to the shape deformation in simulation of Si oxidation.

Still another object of the present invention is to provide a simulation method of Si oxidation that causes no problem even if the oxidation rate is low and the time increment is short.

The above objects together with others not specifically mentioned will become clear to those skilled in the art from the following description.

A simulation method of Si oxidation according to the present invention is comprised of the following steps (a) to (f).

(a) Nodes are configured on a simulation region including a Si region and a SiO$_2$ region.

The SiO$_2$ region is contacted with the Si region to form a Si/SiO$_2$ interface.

(b) A diffusion equation of oxidant is solved at the individual nodes in the SiO$_2$ region to calculate a surface concentration of the oxidant at the Si/SiO$_2$ interface, resulting in a first value of the surface concentration of the oxidant at each of the nodes in a present time step.

(c) The first value of the surface concentration of the oxidant at each of the nodes in the SiO$_2$ region is adjusted to generate a second value of the surface concentration of the oxidant at each of the nodes in the SiO$_2$ region in the present time step.

(d) A thickness increase of the SiO$_2$ region is calculated using the second value of the surface concentration of the oxidant at each of the nodes in the SiO$_2$ region in the present time step.

(e) A new position of the Si/SiO$_2$ interface in the present time step is calculated using the thickness increase of the SiO$_2$ region obtained in the step (d).

(f) Shape or geometry deformations of the Si region and the SiO$_2$ region are calculated using the new position of the Si/SiO$_2$ interface obtained in the step (e).

The steps (a) to (f) are repeated from a first time step to a last time step at intervals of a time increment.

In the step (c) of adjusting the first value of the surface concentration of the oxidant in the present time step, the second value of the surface concentration of the oxidant is set as zero with respect to one of the nodes where the thickness increase of the SiO$_2$ region obtained in the step (d) has a value equal to or less than a specific small value and at the same time, the first value of the surface concentration of the oxidant is stored for a next time step.

The stored first value of the surface concentration of the oxidant is added to a first value of the surface concentration of the oxidant obtained in the next time step, thereby producing a second value of the surface concentration of the oxidant in the next time step. The second value of the surface concentration of the oxidant thus produced is used in the following step (d) of calculating the thickness increase of the SiO$_2$ region in the next time step.

In the step (c) of adjusting the first value of the surface concentration of the oxidant in the present time step, the second value of the surface concentration of the oxidant is set as the first value of the surface concentration of the oxidant with respect to one of the nodes where the thickness increase of the $SiO_2$ region obtained in the step (d) has a value greater than the specific small value.

With the simulation method of Si oxidation according to the present invention, the diffusion equation of the oxidant is solved at the individual nodes in the $SiO_2$ region to calculate the surface concentration of the oxidant at the $Si/SiO_2$ interface, resulting in the first value of the surface concentration of the oxidant at each of the nodes in the present time step in the step (b). Then, in the step (c), the first value of the surface concentration of the oxidant at each of the nodes in the $SiO_2$ region is adjusted to generate the second value of the surface concentration of the oxidant at each of the nodes in the $SiO_2$ region in the present time step.

Also, in the step (c), the second value of the surface concentration of the oxidant in the present time step is set as zero with respect to one of the nodes where the thickness increase of the $SiO_2$ region obtained in the step (d) has a value equal to or less than the specific small value. At the same time as this, the first value of the surface concentration of the oxidant is stored for a next time step.

The stored first value of the surface concentration of the oxidant is added to a first value of the surface concentration of the oxidant obtained in the next time step, thereby producing a second value of the surface concentration of the oxidant in the next time step. The second value of the surface concentration of the oxidant thus produced is used in the following step (d) in the next time step.

Further, in the step (c), in the present time step, the second value of the surface concentration of the oxidant is set as the first value of the surface concentration of the oxidant with respect to one of the nodes where the thickness increase of the $SiO_2$ region obtained in the step (d) has a value greater than the specific small value.

As a result, the simulation time is decreased due to omission or drastic time reduction of the calculation step (f) of calculating the shape or geometry deformations in each of the first to last time steps with respect to the nodes where the thickness increase of the $SiO_2$ region obtained in the step (d) has values equal to or less than the specific small value.

Due to the same reason as above, the unnecessary calculation in the step (f) relating to the shape deformation of the Si and $SiO_2$ regions is able to be omitted.

Further, in the step (c), the first value of the surface concentration of the oxidant at each of the nodes in the $SiO_2$ region is adjusted to generate the second value of the surface concentration of the oxidant at each of the nodes in the $SiO_2$ region in the present time step. Accordingly, there arises no problem even if the oxidation rate of the Si region is low and the time increment is short.

In a preferred embodiment of the simulation method according to the present invention, the step (d) of calculating the thickness increase of the $SiO_2$ region is carried out using an oxidation rate of the Si region. The oxidation rate of the Si region is produced by multiplying the surface concentration of the oxidant by a specific coefficient.

It is preferred that the thickness increase in each of the first to last time steps is calculated by multiplying the oxidation rate of the Si region by the time increment.

In another preferred embodiment of the simulation method according to the present invention, the simulation region has an oxidation mask with a window uncovering the Si region. The oxidant is applied to the Si region through the window of the mask, thereby oxidizing the Si region selectively.

For example, the specific small value used in the step (c) is set as 1 Å.

BRIEF DESCRIPTION OF THE DRAWINGS

In order that the present invention may be readily carried into effect, it will now be described with reference to the accompanying drawings.

FIG. 1 is a flowchart showing the steps of a conventional simulation method of an oxidation process of a Si region.

FIGS. 2A to 2C are schematic illustrations showing the one-dimensional, time-dependent shape change of Si and $SiO_2$ regions in an oxidation process, respectively, to which the conventional simulation method shown in FIG. 1 is applied.

DETAILED DESCRIPTION OF THE PREFERRED EMBODIMENTS

Figure 3:
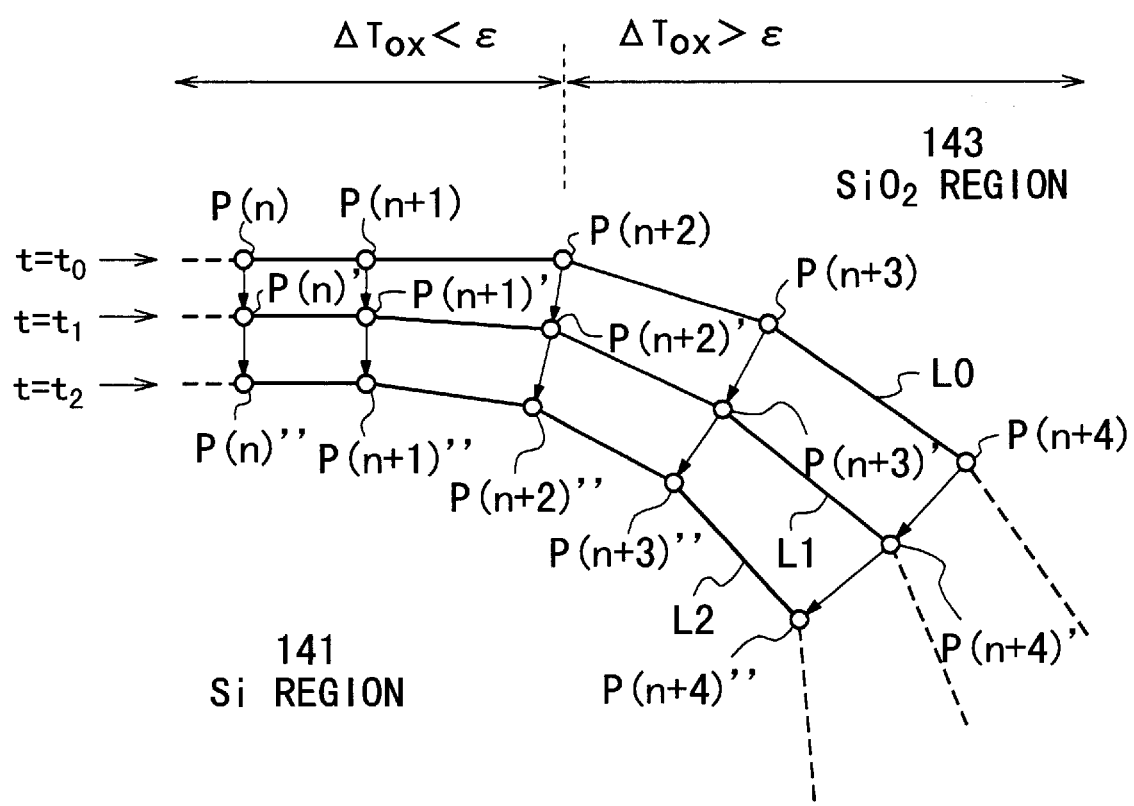
FIG. 3 is a schematic illustration showing the two-dimensional, time-dependent shape change of Si and $SiO_2$ regions in an oxidation process, to which the conventional simulation method shown in FIG. 1 is applied.

Preferred embodiments of the present invention will be described in detail below while referring to the drawings attached.

Figure 4:
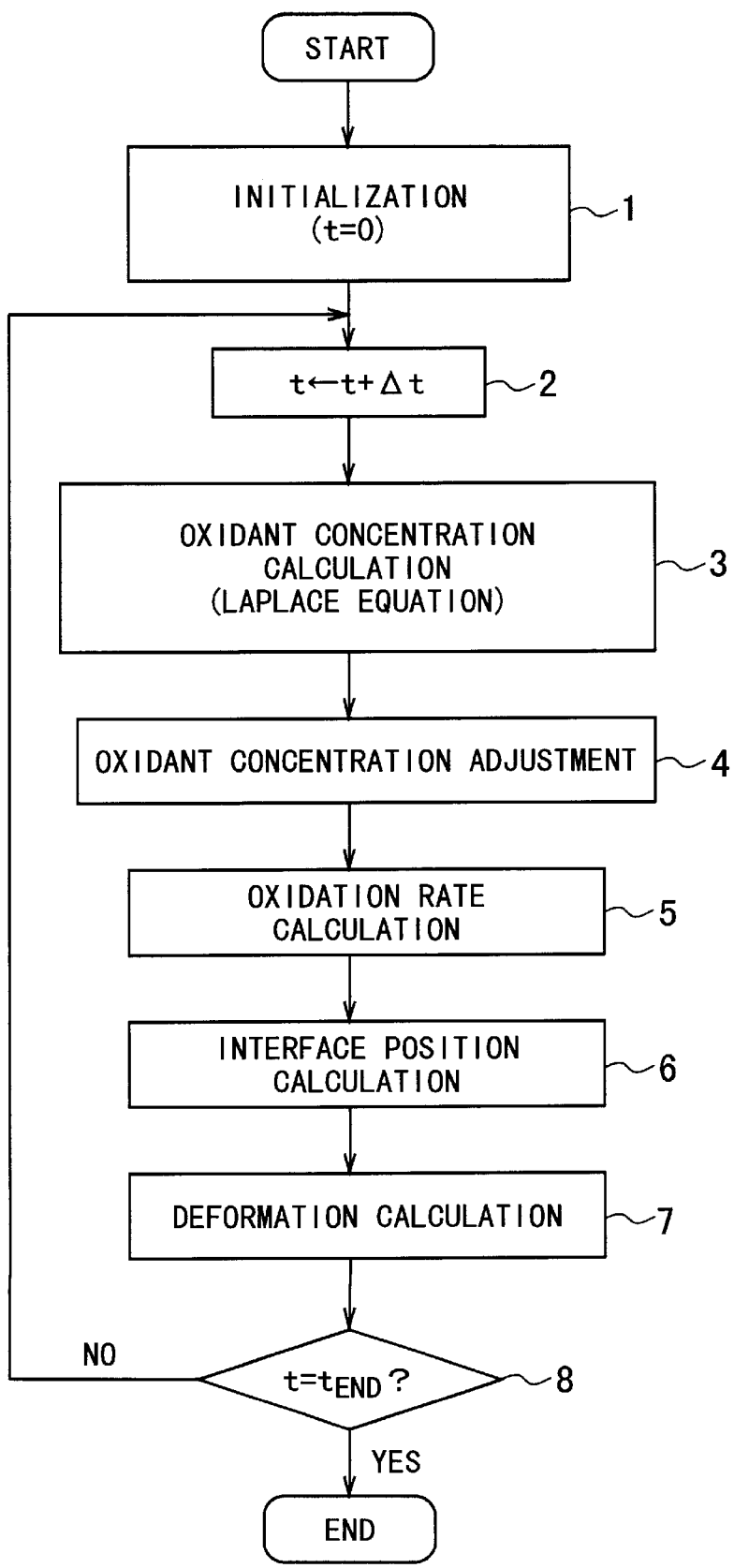
FIG. 4 is a flowchart showing the steps of a simulation method of an oxidation process of a Si region according to an embodiment of the present invention.

A simulation method according to an embodiment of the present invention has the steps shown in FIG. 4.

As shown in FIG. 4, in the step 1, desired nodes $P_n$ are configured onto a simulation zone where a $SiO_2$ region is formed in contact with a Si region, and at the same time, the predetermined initial condition are applied to the individual nodes $P_n$ for setting the initial data. Also, the value of the time t is set as zero, i.e., t=0.

As already explained in "Description of the Prior Art", in the simulation method according to the embodiment, it is assumed that the $SiO_2$ region initially exists in contact with the Si region prior to the start of the oxidation process in consideration of a native $SiO_2$ film. Therefore, the $SiO_2$ region is assumed to be contacted with the Si region at the start of oxidation.

For example, the following parameters are used as the initial condition. The value of the diffusion coefficient of oxidant is determined according to the oxidation temperature. The value of the oxidation reaction rate of the Si region is determined according to the temperature, pressure, and so on of the oxidizing atmosphere and the concentration of a dopant that has been introduced into the Si region. The values of the Young's modulus of elasticity and the Poisson's ratio are determined according to the material to be oxidized.

In the step 2, the value of a preset time increment Δt is added to the present value (i.e., 0) of the time t. Thus, a first one of the time steps is started.

In the step 3, the following diffusion equation (4) (i.e., the Laplace's equation) of oxidant is constituted in the $SiO_2$ region, where $C_{ox}$ is the concentration of the oxidant and $D_{ox}$ is the diffusion coefficient of the oxidant. This is because the oxidant existing in the oxidizing atmosphere is diffused through the $SiO_2$ region to the opposing surface of the Si region.

$$D_{ox} \cdot \nabla^2 C_{ox} = 0 \qquad (4)$$

Then, the diffusion equation (4) is discretely solved at the individual nodes $P_n$, thereby finding the surface concentration $C_{ox}^{surf}$ of the oxidant at the interface between the Si and $SiO_2$ regions (i.e., the $Si/SiO_2$ interface) in the first time step.

The diffusion equation (4) may be discretely solved at the nodes $P_n$ by the use of the finite difference method (i.e., control volume method) or the finite element method.

Subsequently, in the step 4, the surface concentration $C_{ox}^{surf}$ of the oxidant at the $Si/SiO_2$ interface at the nodes $P_n$ thus found is adjusted in consideration of the magnitude of growth of the $SiO_2$ region in each time step.

Specifically, if the value of the thickness increase of the $SiO_2$ region is greater than a predetermined small value such as 1 Å at some of the nodes $P_n$, the value of the surface concentration $C_{ox}^{surf}$ of the oxidant thus found in the step 3 is used in the following step 5 of calculating the oxidation rate of the Si region.

On the other hand, if the value of the thickness increase of the $SiO_2$ region is equal to or less than the predetermined small value, this value is not used and the surface concentration $C_{ox}^{surf}$ is set as zero (0). Then, the surface concentration $C_{ox}^{surf}$ of 0 is used in the following step 5.

Also, the value of the surface concentration $C_{ox}^{surf}$ of the oxidant thus found in the step 3 is stored for a next or second time step. In the next or second time step, the value found in the first time step is added to a value found in the second time step, and then, the sum of the values in the first and second time steps is compared with the predetermined small value. The subsequent process is the same as in the first time step.

If the sum of the values found in the first and second time steps is greater than the predetermined small value, this sum of the values is used in the following step 5 as the surface concentration $C_{ox}^{surf}$ of the oxidant. If the sum of the values found in the first and second time steps is equal to or less than the predetermined small value, this sum of the values is stored for a next or third time step.

This adjustment step 4 is carried out with respect to the individual nodes $P_n$ in each time step.

The detailed explanation about the step 4 of oxidation concentration adjustment is given later.

In the step 5, using the value of the surface concentration $C_{ox}^{surf}$ of the oxidant adjusted in the step 4 in the first time step, the oxidation rate $(dT_{ox}/dt)$ of the Si region, which is given by the time-dependent thickness $T_{ox}$ of the $SiO_2$ region, is calculated by the use of the following equation (5) with respect to the individual nodes $P_n$ $$\frac{dT_{ox}}{dt} = K \cdot C_{ox}^{surf} \qquad (5)$$

where K is a coefficient of the oxidation reaction. The orientation of the oxidation rate $(dT_{ox}/dt)$ of the Si region is set in a direction perpendicular to the $Si/SiO_2$ interface. This step 5 is the same as the step 104 in FIG. 1.

The equation (5) means that the oxidation rate of the Si region, i.e., the time-dependent thickness $(dT_{ox}/dt)$ of the $SiO_2$ region, is proportional to the surface concentration $C_{ox}^{surf}$ of the oxidant at the $Si/SiO_2$ interface is assumed in this simulation method according to the embodiment.

In the step 6, new or post-oxidation positions of the individual nodes $P_n$ are calculated by the use of the corresponding oxidation rates $(dT_{ox}/dt)$ thus found in the step 5 and the time increment Δt. Thus, the new or post-oxidation position of the $Si/SiO_2$ interface is found. This step 6 is the same as the step 105 in FIG. 1.

In the step 7, using the new or post-oxidation position of the $Si/SiO_2$ interface thus found in the step 6, the shape or geometric deformation of the Si and $SiO_2$ regions due to oxidation in the first time step is calculated. This step 7 is the same as the step 106 in FIG. 1.

The calculation of the shape or geometry deformations at the individual nodes $P_n$ may be carried out by the use of any known method, an example of which is disclosed in the previously-referred book edited by K. Taniguchi.

In the step 8, it is judged whether the present value of the time t in the first time step is equal to the value of the end time $t_{END}$ or not. If the answer is "NO", the second time step is started and the steps 2 to 7 is performed again. Further, in the same way as above, the steps 2 to 7 are repeated in the third time step and later time steps until the answer of "YES" is given. If the answer is "YES", the flow of the steps 2 to 7 is stopped. The step 8 is the same as the step 107 in FIG. 1.

Next, the step 4 of adjusting the oxidation concentration in FIG. 4, which is the feature of the present invention, is explained in detail below with reference to FIG. 5.

Figure 5:
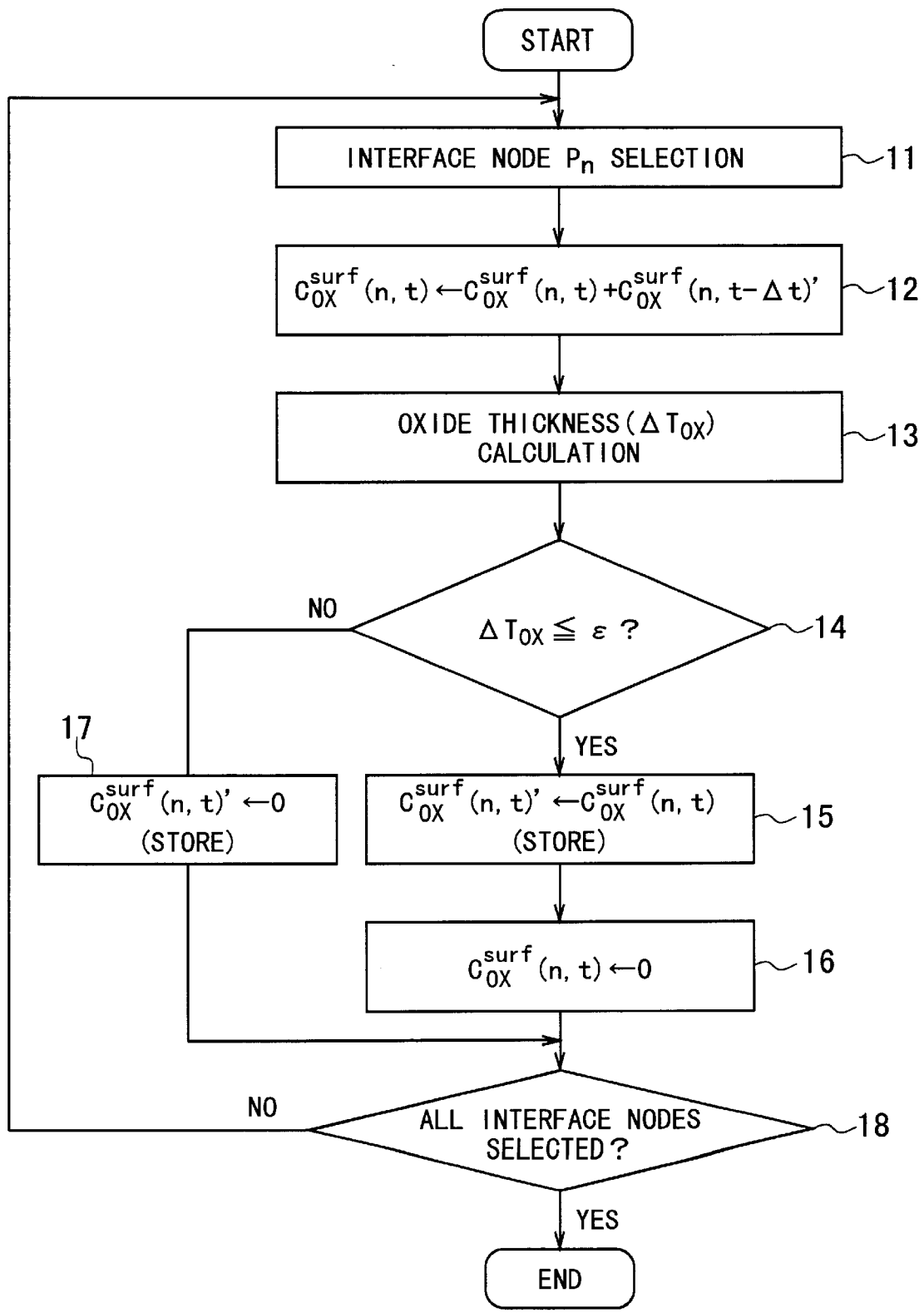
FIG. 5 is a flowchart showing the detail of the step of oxidant concentration adjustment shown in FIG. 4.

In FIG. 5, the surface concentration $C_{ox}^{surf}$ of the oxidant at the node $P_n$ at the present time t is expressed as $C_{ox}^{surf}(n, t)$, and the surface concentration $C_{ox}^{surf}$ of the oxidant at the node $P_n$ at the prior time (t−Δt) is expressed as $C_{ox}^{surf}(n, t-\Delta t)$.

First, one of the nodes $P_n$ located at the interface of the Si and $SiO_2$ regions is selected in the step 11.

Next, in the step 12, the stored surface concentration $C_{ox}^{surf}$ of the oxidant at the selected one of the nodes $P_n$ at the prior time (t−Δt), i.e., $C_{ox}^{surf}(n, t-\Delta t)'$, is added to the surface concentration $C_{ox}^{surf}$ of the oxidant at the same node $P_n$ at the present time t, i.e., $C_{ox}^{surf}(n, t)$. Then, the result of this addition (i.e., the sum of the two concentration values) is used as the surface concentration $C_{ox}^{surf}$ of the oxidant at the same node $P_n$ at the present time t.

In the step 13, using the surface concentration $C_{ox}^{surf}$ of the oxidant thus obtained in the step 12, the thickness increase $\Delta T_{ox}$ of the $SiO_2$ region in the time t at the same node $P_n$ is calculated according to the following equation (6).

$$\Delta T_{ox} = K \cdot C_{ox}^{surf} \cdot \Delta t \qquad (6)$$

The equation (6) means that the thickness increase $\Delta T_{ox}$ of the $SiO_2$ region is expressed as the product of the oxidation rate $(dT_{ox}/dt)$ and the time increment Δt.

In the step 14, the value of the thickness increase $\Delta T_{ox}$ of the $SiO_2$ region at the present time t at the same node $P_n$ is compared with the predetermined small value $\epsilon$.

If the value of the thickness increase $\Delta T_{ox}$ of the $SiO_2$ region is equal to or less than the predetermined slight value $\epsilon$, the step 15 is carried out. In the step 15, the surface concentration $C_{ox}^{surf}(n, t)$ of the oxidant at the same node $P_n$ at the present time t is stored in a storage medium such as a register, resulting in a stored surface concentration $C_{ox}^{surf}(n, t)'$. Next, in the subsequent step 16, the surface concentration $C_{ox}^{surf}(n, t)$ at the present time t is set as zero. Then, the flow is progressed to the step 18.

On the other hand, if the value of the thickness increase $\Delta T_{ox}$ of the $SiO_2$ region is greater than the predetermined slight value $\epsilon$, the step 17 is carried out after the step 14. In the step 17, the stored surface concentration $C_{ox}^{surf}(n, t)'$ of the oxidant at the same node $P_n$ at the present time t is set as zero (0). Then, the flow is jumped to the step 18.

In the step 18, it is judged whether all of the nodes $P_n$ are selected or not. If the answer is "NO", the steps 11 to 18 are carried out again and repeated until the answer is "YES", i.e., all of the nodes $P_n$ are selected. If the answer is "YES", the flow is stopped.

As explained with reference to FIG. 5, if the value of the thickness increase of the $SiO_2$ region is greater than the predetermined value $\epsilon$ at some of the nodes $P_n$, the value of the surface concentration $C_{ox}^{surf}$ of the oxidant thus found in the step 3 is used in the following step 5 of calculating the oxidation rate of the Si region according to the steps 14 and 17.

On the other hand, if the value of the thickness increase of the $SiO_2$ region is equal to or less than the predetermined small value, this value is not used and the surface concentration $C_{ox}^{surf}$ is set as zero (0). Then, the surface concentration $C_{ox}^{surf}$ of 0 is used in the following step 5 according to the steps 14 to 16.

Also, the value of the surface concentration $C_{ox}^{surf}$ of the oxidant thus found in the step 3 is stored for the next or second time step. In the next or second time step, the value of the surface concentration $C_{ox}^{surf}$ of the oxidant found in the first time step is added to a value of the surface concentration $C_{ox}^{surf}$ of the oxidant found in the second time step, and then, the sum of the two values in the first and second time steps is compared with the predetermined small value $\epsilon$. The subsequent process is the same as in the first time step.

If the sum of the values of the surface concentration $C_{ox}^{surf}$ of the oxidant found in the first and second time steps is greater than the predetermined small value $\epsilon$, this sum of the two values is used in the following step 5 as the surface concentration $C_{ox}^{surf}$ of the oxidant. If the sum of the values found in the first and second time steps is equal to or less than the predetermined small value, this sum of the values is stored for a next or third time step.

As explained above, with the simulation method according to the embodiment of the present invention, if the value of the thickness increase $\Delta T_{ox}$ of the $SiO_2$ region is greater than the predetermined slight value $\epsilon$, the value of the thickness increase $\Delta T_{ox}$ of the $SiO_2$ region is calculated in the step 13 using the result of the addition carried out in the step 12. Since the stored surface concentration $C_{ox}^{surf}(n, t)'$ of the oxidant is set as zero, the result of the addition in the step 12 is equal to the surface concentration $C_{ox}^{surf}(n, t)$ of the oxidant at the present time t. This means that the surface concentration $C_{ox}^{surf}(n, t)$ of the oxidant at the present time t is used without any change for calculation of the thickness increase $\Delta T_{ox}$ in the step 13, which is the same as that in the conventional simulation method shown in FIG. 1.

However, if the thickness increase $\Delta T_{ox}$ of the $SiO_2$ region is equal to or less than the predetermined slight value $\epsilon$, the surface concentration $C_{ox}^{surf}(n, t)$ of the oxidant at the present time is set as zero in the step 16. Therefore, the thickness increase $\Delta T_{ox}$ is equal to zero at the selected one of the nodes $P_n$ from the equation (6). This means that the thickness of the $SiO_2$ region exhibits no increase or growth at the selected one of the nodes $P_n$.

Thereafter, if the value of the thickness increase $\Delta T_{ox}$ is greater than the predetermined value $\epsilon$ at a subsequent time step, the thickness of the $SiO_2$ region is increased at a time according to the result (i.e., the sum) of the addition in the step 12.

As seen from the above explanation, the deformation calculation in the step 7 in FIG. 4 necessitating a very long calculation time can be substantially omitted or drastically reduced with respect to some of the nodes $P_n$ where $\Delta T_{ox} \leq \epsilon$ at some of the total time steps. Accordingly, the simulation time can be decreased while causing no problem even if the oxidation rate ($T_{ox}/dt$) is low and the time increment $\Delta t$ is short.

Figure 6A:
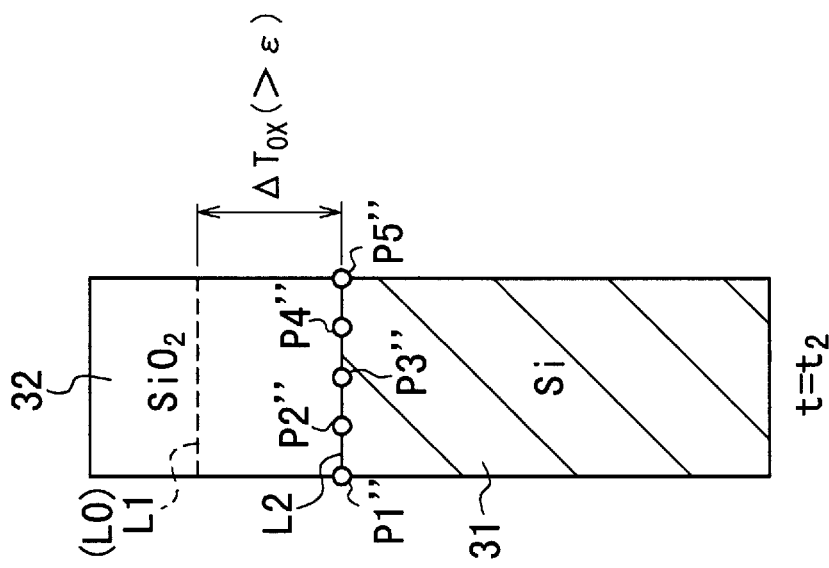
FIGS. 6A to 6C are schematic illustrations showing the one-dimensional, time-dependent shape change of Si and $SiO_2$ regions in an oxidation process, respectively, to which the simulation method according to the embodiment of the present invention shown in FIG. 4 is applied.
Figure 6B:
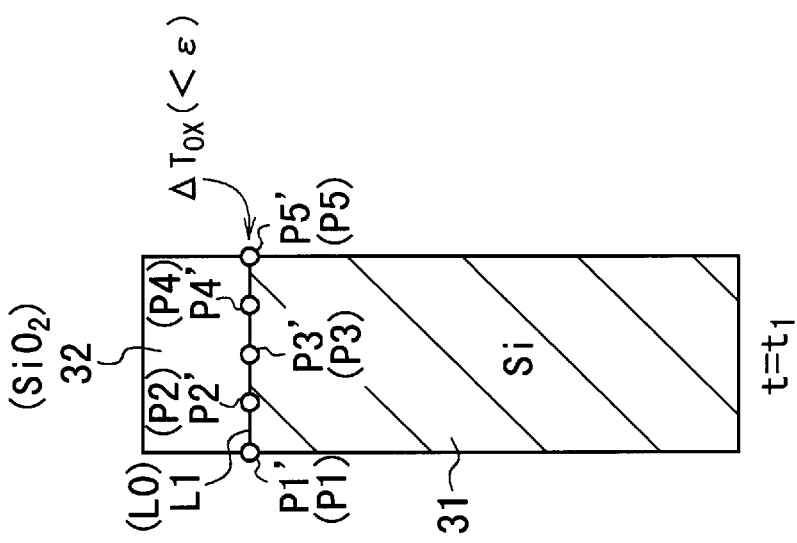
Figure 6C:
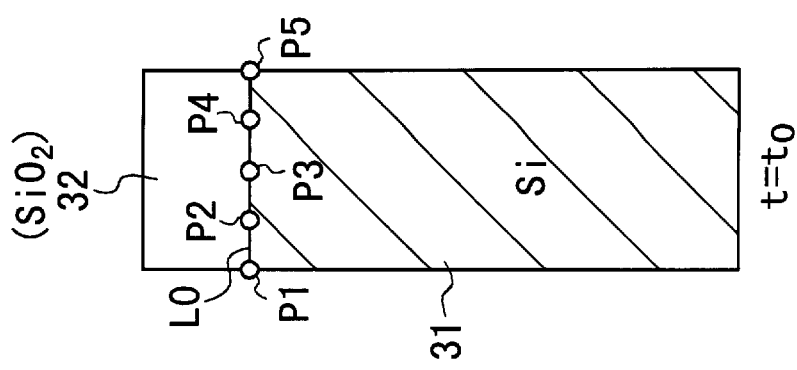

FIGS. 6A to 6C schematically show the one-dimensional, time-dependent shape change of Si and $SiO_2$ regions in an oxidation process, to which the above-described simulation method according to the embodiment of the present invention is applied.

At the time $t_0$, as shown in FIG. 6A, nodes P1, P2, P3, P4, and P5 are configured one-dimensionally along an interface L0 between Si and $SiO_2$ regions 31 and 32. The nodes P1, P2, P3, P4, and P5 are equally spaced along the Si/$SiO_2$ interface L0.

Although not shown in FIGS. 6A to 6C, it is needless to say that other nodes are configured two-dimensionally on the whole Si and $SiO_2$ regions 31 and 32.

In the simulation method according to the embodiment, the shift of the nodes P1, P2, P3, P4, and P5 does not occur when the thickness increment $\Delta T_{ox}$ is equal to or less than the specific value $\epsilon$ (i.e., $\Delta T_{ox} \leq \epsilon$). Therefore, if the thickness increment $\Delta T_{ox}$ is less than the specific value $\epsilon$ at the time $t_1$ after the specific time increment $\Delta t$ from the time $t_0$, the nodes P1, P2, P3, P4, and P5 are held at the same positions and as a result, the Si/$SiO_2$ interface L0 is not moved, as shown in FIG. 6B.

In FIG. 6B, new nodes P1', P2', P3', P4', and P5' and a new Si/$SiO_2$ interface L1 are overlapped with the nodes P1, P2, P3, P4, and P5 and the Si/$SiO_2$ interface L0, respectively. Accordingly, the Si and $SiO_2$ regions 31 and 32 have the same shapes or geometry, as shown in FIG. 6A.

If the thickness increment $\Delta T_{ox}$ becomes greater than the specific value $\epsilon$ at the time $t_2$ after the specific time increment $\Delta t$ from the time $t_1$, the nodes P1', P2', P3', P4', and P5' are shifted at a time perpendicular to the Si/$SiO_2$ interface L1 toward the Si region 31. Thus, the nodes P1', P2', P3', P4', and P5' and the Si/$SiO_2$ interface L1 are moved to their new positions, resulting in new nodes P1", P2", P3", P4", and P5" and a new Si/$SiO_2$ interface L2, as shown in FIG. 6C.

As a result, the deformation calculation in the step 7 necessitating a very long calculation time can be substantially omitted or drastically reduced with respect to some of the nodes P1', P2', P3', P4', and P5' where $\Delta T_{ox} \leq \epsilon$ at the time $t_1$. Accordingly, the simulation time can be decreased while causing no problem even if the oxidation rate ($T_{ox}/dt$) is low and the time increment $\Delta t$ is short.

Figure 7:
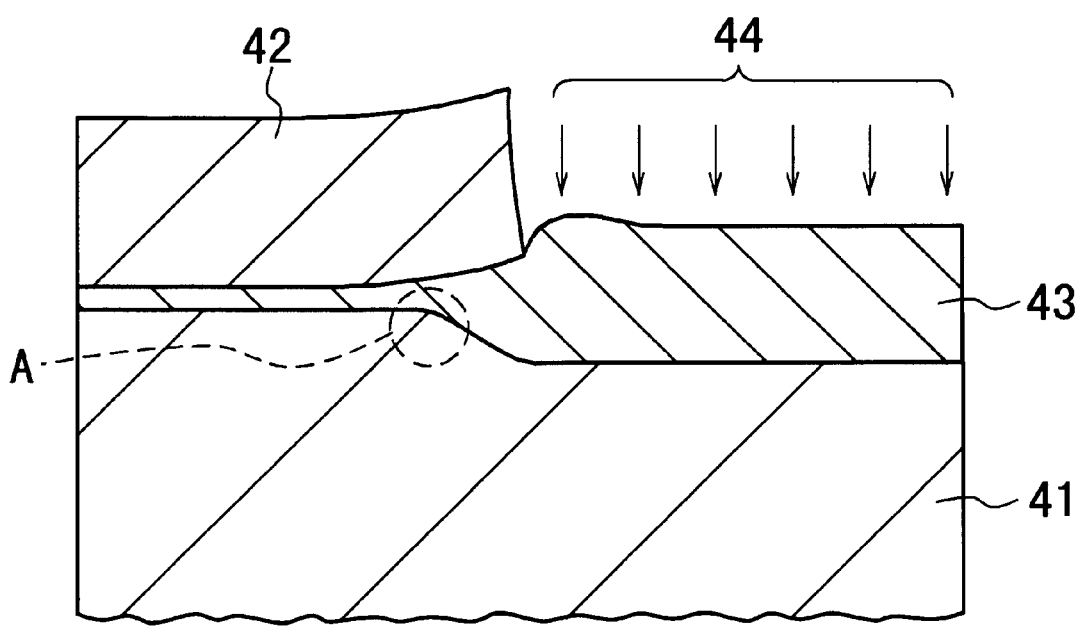
FIG. 7 is a schematic partial cross-sectional view of a single-crystal Si substrate with an oxidation mask made of $Si_3N_4$ on its surface, which shows the state during the LOCOS process.

FIG. 7 schematically shows the state of the LOCOS process, in which a single-crystal Si substrate (i.e., Si region) 41 with an oxidation mask 42 made of $Si_3N_4$ on its surface. The reference numeral 43 denotes a $SiO_2$ film (i.e., SiO₂ region) formed on the substrate 41 and the reference numeral 44 denotes the flux of oxidant existing in an oxidizing atmosphere.

The oxidant in the atmosphere diffuses into the SiO₂ region 43 through a window of the mask 42, and passes through the region 43 to the opposing surface of the Si substrate 41. In the area sufficiently apart from the edge of the mask 42, the concentration of the oxidant in the SiO₂ region 43 is high enough for oxidation and consequently, the thickness increase or growth of the SiO₂ region 43 is observed distinctly. However, in the vicinity of the edge of the mask 42, the concentration of the oxidant in the SiO₂ region 43 is very low and the thickness increase or growth of the SiO₂ region 43 is slight. The simulation method according to the embodiment of the present invention utilizes this fact.

Figure 8A:
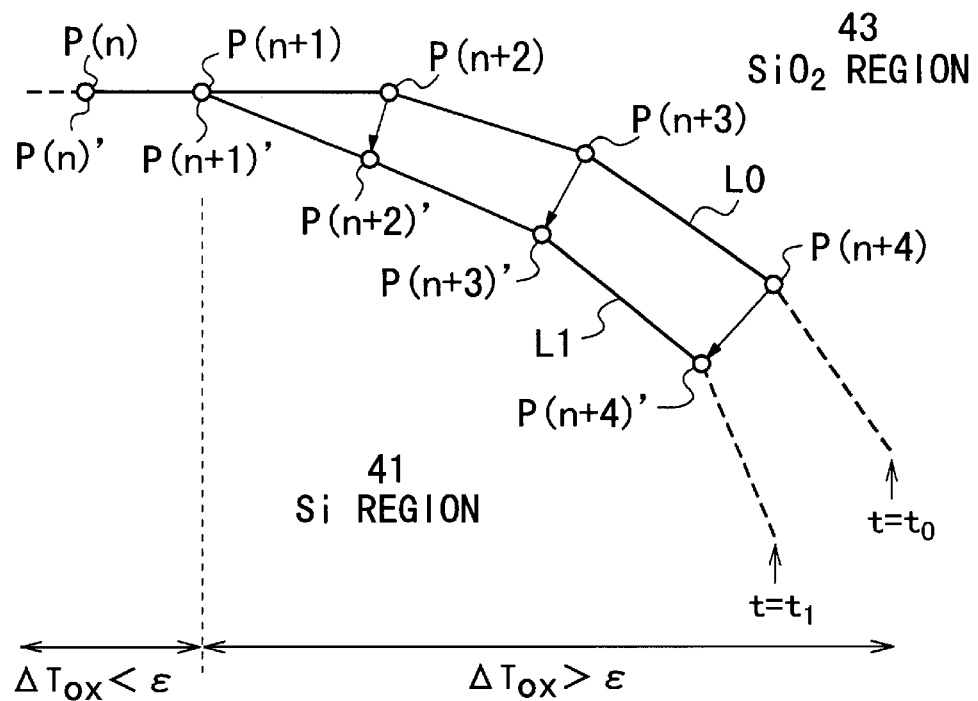
FIG. 8A is a schematic illustration showing the two-dimensional, time-dependent shape change of the Si and $SiO_2$ regions in an oxidation process before the growth of the $SiO_2$ region starts at the nodes where $\Delta T_{ox} < \epsilon$, to which the simulation method according to the embodiment of the present invention shown in FIG. 4 is applied.
Figure 8B:
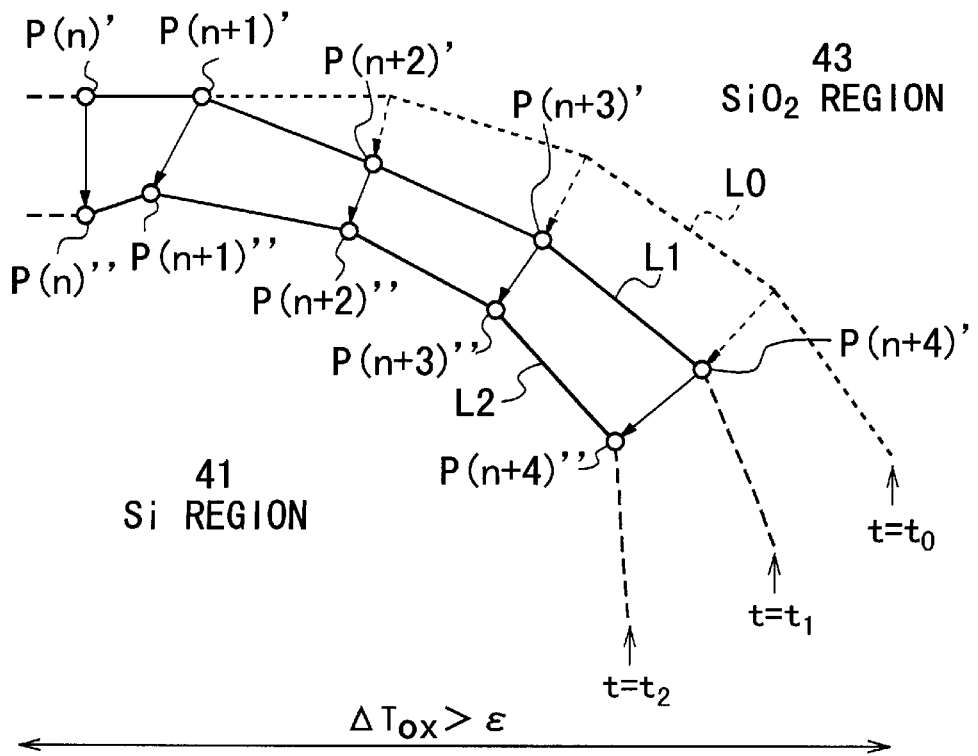
FIG. 8B is a schematic illustration showing the two-dimensional, time-dependent shape change of the Si and $SiO_2$ regions in an oxidation process after the growth of the $SiO_2$ region has started at the nodes where $\Delta T_{ox} < \epsilon$, to which the simulation method according to the embodiment of the present invention shown in FIG. 4 is applied.

FIGS. 8A and 8B schematically show the two-dimensional, time-dependent shape change of the Si and Sio₂ regions 41 and 43 in an oxidation process, to which the above-described simulation method according to the embodiment of the present invention shown in FIG. 4 is applied.

At the time $t_0$, nodes P(n), P(n+1), P(n+2), P(n+3), and P(n+4) are configured two-dimensionally along an interface L0 between the Si and SiO₂ regions 41 and 43, as shown in FIGS. 8A and 8B. The nodes P(n), P(n+1), P(n+2), P(n+3), and P(n+4) are spaced along the Si/SiO₂ interface L0.

At the time $t_1$ after a specific time increment Δt from the time $t_0$, as shown in FIG. 8A, the nodes P(n+2), P(n+3), and P(n+4) are shifted toward the Si region 41, resulting in new nodes P(n+2)', P(n+3)', and P(n+4)'. However, the nodes P(n) and P(n+1) are not shifted toward the Si region 41. This is because the values of the thickness increment $\Delta T_{ox}$ are greater than the specific value ε at the time $t_1$ at the nodes P(n+2), P(n+3), and P(n+4) while the values of the thickness increment $\Delta T_{ox}$ are less than the specific value ε at the time $t_1$ at the nodes P(n) and P(n+1). Therefore, new nodes P(n)' and P(n+1)' are overlapped with the nodes P(n) and P(n+1), respectively. The state at this stage is shown in FIG. 8A.

If the values of the thickness increment $\Delta T_{ox}$ become greater than the specific value ε at the time $t_2$ after the specific time increment Δt from the time $t_1$, as shown in FIG. 8B, the nodes P(n)', P(n+1)', P(n+2)', P(n+3)', and P(n+4)' are shifted at a time perpendicular to the Si/SiO₂ interface L1 toward the Si region 41. Thus, all the nodes P(n)', P(n+1)', P(n+2)', P(n+3)', and P(n+4)' are moved to their new positions, resulting in new nodes P(n)", P(n+1)", P(n+2)", P(n+3)", and P(n+4)". The new nodes P(n)", P(n+1)", P(n+2)", P(n+3)", and P(n+4)" are located on a new Si/SiO₂ interface L2.

As a result, the deformation calculation in the step 7 necessitating a very long calculation time can be substantially omitted or drastically reduced with respect to the nodes P(n) and P(n+1) where $\Delta T_{ox} \leq \epsilon$ at the time $t_1$. Accordingly, the simulation time can be decreased while causing no problem even if the oxidation rate ($T_{ox}/dt$) is low and the time increment Δt is short.

Although not shown here, the nodes may be configured three-dimensionally in the present invention.

In the above-described embodiment, a thermal oxidation process of Si is simulated. However, it is needless to say that the simulation method of the present invention may be applied to any other oxidation process.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A method of fabricating a semiconductor device including simulating silicon oxidation to determine a time-dependent shape change of a Si region and a SiO₂ region connected to said Si region in an oxidation process, said simulating silicon oxidation comprising the steps of:

(a) configuring nodes on a simulation region including a Si region and a SiO₂ region, said SiO₂ region connected to said Si region to form a Si/SiO₂ interface;

(b) solving a diffusion equation of said oxidant at said individual nodes in said SiO₂ region to calculate a surface concentration of said oxidant at said Si/SiO₂ interface, resulting in a first value of said surface concentration of said oxidant at each of said nodes in a present time step;

(c) adjusting said first value of said surface concentration of said oxidant at each of said nodes in said SiO₂ region to generate a second value of said surface concentration of said oxidant at each of said nodes in said SiO₂ region in said present time step;

(d) calculating a thickness increase of said SiO₂ region using said second value of said surface concentration of said oxidant at each of said nodes in said SiO₂ region in said present time step;

(e) calculating a new position of said Si/SiO₂ interface in said present time step using said thickness increase of said SiO₂ region obtained in said step (d); and (f) calculating shape deformations of said Si region and said SiO₂ region using said new position of said Si/SiO₂ interface obtained in said step (e).

wherein said steps (a) to (f) are repeated from a first time step to a last time step at intervals of a time increment, wherein in said step (c) of adjusting said first value of said surface concentration of said oxidant in said present time step, said second value of said surface concentration of said oxidant is set as zero with respect to one of said nodes where said thickness increase of said SiO₂ region obtained in said step (d) has a value equal to or less than a specific small value and at the same time, said first value of said surface concentration of said oxidant is stored for a next time step, wherein said stored first value of said surface concentration of said oxidant is added to a first value of said surface concentration of said oxidant obtained in said next time step, thereby producing a second value of said surface concentration of said oxidant in said next time step, said second value of said surface concentration of said oxidant thus produced being used in the following step (d) of calculating said thickness increase of said SiO₂ region in said next time step, and wherein in said step (c) of adjusting said first value of said surface concentration of said oxidant in said present time step, said second value of said surface concentration of said oxidant is set as said first value of said surface concentration of said oxidant with respect to one of said nodes where said thickness increase of said SiO₂ region obtained in said step (d) has a value greater than said specific small value.

2. The method as claimed in claim 1, wherein said step (d) of calculating said thickness increase of said SiO₂ region is carried out using an oxidation rate of said Si region;

and wherein said oxidation rate of said Si region is produced by multiplying said surface concentration of said oxidant by a specific coefficient.

3. The method as claimed in claim 2, wherein said thickness increase in each of said first to last time steps is calculated by multiplying said oxidation rate of said Si region by said time increment.

4. The method as claimed in claim 1, wherein said simulation region has an oxidation mask with a window uncovering said Si region;
and wherein said oxidant is applied to said Si region through said window of said mask, thereby oxidizing said Si region selectively.

5. The method as claimed in claim 1, wherein said specific small value used in said step (c) is set as 1 Å.

6. A method of fabricating a semiconductor device including simulating silicon oxidation to determine a time-dependent shape change of a Si region and a $SiO_2$ region connected to said Si region in an oxidation process, said simulating silicon oxidation being computer-implemented and comprising the steps of:
  (a) configuring nodes on a simulation region including a Si region and a $SiO_2$ region; said $SiO_2$ region connected to said Si region to form a $Si/SiO_2$ interface;
  (b) solving a diffusion equation of said oxidant at said individual nodes in said $SiO_2$ region to calculate a surface concentration of said oxidant at said $Si/SiO_2$ interface, resulting in a first value of said surface concentration of said oxidant at each of said nodes in a present time step;
  (c) adjusting said first value of said surface concentration of said oxidant at each of said nodes in said $SiO_2$ region to generate a second value of said surface concentration of said oxidant at each of said nodes in said $SiO_2$ region in said present time step;
  (d) calculating a thickness increase of said $SiO_2$ region using said second value of said surface concentration of said oxidant at each of said nodes in said $SiO_2$ region in said present time step;
  (e) calculating a new position of said $Si/SiO_2$ interface in said present time step using said thickness increase of said $SiO_2$ region obtained in said step (d); and
  (f) calculating shape deformations of said Si region and said $SiO_2$ region using said new position of said $Si/SiO_2$ interface obtained in said step (e):
  wherein said steps (a) to (f) are repeated from a first time step to a last time step at intervals of a time increment,
  wherein in said step (c) of adjusting said first value of said surface concentration of said oxidant in said present time step, said second value of said surface concentration of said oxidant is set as zero with respect to one of said nodes where said thickness increase of said $SiO_2$ region obtained in said step (d) has a value equal to or less than a specific small value and at the same time, said first value of said surface concentration of said oxidant is stored for a next time step,
  wherein said stored first value of said surface concentration of said oxidant is added to a first value of said surface concentration of said oxidant obtained in said next time step, thereby producing a second value of said surface concentration of said oxidant in said next time step, said second value of said surface concentration of said oxidant thus produced being used in the following step (d) of calculating said thickness increase of said $SiO_2$ region in said next time step, and
  wherein in said step (c) of adjusting said first value of said surface concentration of said oxidant in said present time step, said second value of said surface concentration of said oxidant is set as said first value of said surface concentration of said oxidant with respect to one of said nodes where said thickness increase of said $SiO_2$ region obtained in said step (d) has a value greater than said specific small value.

7. The method of claim 6, wherein said step (d) of calculating said thickness increase of said $SiO_2$ region is carried out using an oxidation rate of said Si region, and wherein said oxidation rate of said Si region is produced by multiplying said surface concentration of said oxidant by a specific coefficient.

8. The method of claim 6, wherein said thickness increase in each of said first to last time steps is calculated by multiplying said oxidation rate of said Si region by said time increment.

9. The method of claim 6, wherein said simulation region has an oxidation mask with a window uncovering said Si region, and wherein said oxidant is applied to said Si region through said window of said masks, thereby oxidizing said Si region selectively.

10. The method of claim 6, wherein said specific small value used in said step (c) is set as 1 Å.

11. A method of fabricating a semiconductor device including simulating silicon oxidation to determine a time-dependent shape change of a Si region and a $SiO_2$ region connected to said Si region in an oxidation process, said simulating silicon oxidation comprising:
  (a) configuring nodes on a simulation region including a Si region and a $SiO_2$ region; said $SiO_2$ region connected to said Si region to form a $Si/SiO_2$ interface;
  (b) solving a diffusion equation of said oxidant at said individual nodes in said $SiO_2$ region to calculate a surface concentration of said oxidant at said $Si/SiO_2$ interface, resulting in a first value of said surface concentration of said oxidant at each of said nodes in a present time;
  (c) adjusting said first value of said surface concentration of said oxidant at each of said nodes in said $SiO_2$ region to generate a second value of said surface concentration of said oxidant at each of said nodes in said $SiO_2$ region in said present time;
  (d) calculating a thickness increase of said $SiO_2$ region using said second value of said surface concentration of said oxidant at each of said nodes in said $SiO_2$ region in said present time;
  (e) calculating a new position of said $Si/SiO_2$ interface in said present time using said thickness increase of said $SiO_2$ region obtained in said calculating the thickness increase of said $SiO_2$ region; and
  (f) calculating shape deformations of said Si region and said $SiO_2$ region using said new position of said $Si/SiO_2$ interface obtained in said calculating a new position of said $Si/SiO_2$ interface,
  wherein said steps (a) to (f) are repeated from a first time to a last time at intervals of a time increment,
  wherein said adjusting said first value of said surface concentration of said oxidant in said present time, said second value of said surface concentration of said oxidant is set as zero with respect to one of said nodes where said thickness increase of said $SiO_2$ region obtained during said calculating a thickness increase of said $SiO_2$ region has a value equal to or less than a specific small value and at the same time, said first value of said surface concentration of said oxidant is stored for a next time, wherein said stored first value of said surface concentration of said oxidant is added to a first value of said surface concentration of said oxidant obtained in said next time, thereby producing a second value of said surface concentration of said oxidant in said next time, said second value of said surface concentration of said oxidant thus produced being used in the following said calculating said thickness increase of said $SiO_2$ region in said next time, and wherein in said adjusting said first value of said surface concentration of said oxidant in said present time, said second value of said surface concentration of said oxidant is set as said first value of said surface concentration of said oxidant with respect to one of said nodes where said thickness increase of said $SiO_2$ region obtained during said calculating said thickness increase of said $SiO_2$ region has a value greater than said specific small value.

12. The method of claim 11, wherein said calculating said thickness increase of said $SiO_2$ region is carried out using an oxidation rate of said Si region, and wherein said oxidation rate of said Si region is produced by multiplying said surface concentration of said oxidant by a specific coefficient.

13. The method of claim 11, wherein said thickness increase in each of said first to last time is calculated by multiplying said oxidation rate of said Si region by said time increment.

14. The method of claim 11, wherein said simulation region has an oxidation mask with a window uncovering said Si region, and wherein said oxidant is applied to said Si region through said window of said masks, thereby oxidizing said Si region selectively.

15. The method of claim 11, wherein said specific small value used in said adjusting said first value of said surface concentration of said oxidant at each of said nodes in said $SiO_2$ region is set as 1 Å.

16. The method of claim 1, wherein a deformation calculation is performed only for time intervals in which said thickness increase in said $SiO_2$ region exceeds a predetermined small value.

* * * * *